United States Patent
Aichriedler et al.

(10) Patent No.: US 7,348,687 B2
(45) Date of Patent: Mar. 25, 2008

(54) DRIVING CIRCUIT FOR AN IGNITION ELEMENT OF A PASSENGER PROTECTION SYSTEM

(75) Inventors: Leo Aichriedler, Ebersberg (DE); Michael Breunig, Villach (AT); Hubert Rothleitner, Villach (AT); Udo John, München (DE)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 10/950,193

(22) Filed: Sep. 24, 2004

(65) Prior Publication Data

US 2005/0127755 A1   Jun. 16, 2005

(30) Foreign Application Priority Data

Sep. 26, 2003   (DE) ................. 103 44 841

(51) Int. Cl.
*B60L 1/00*   (2006.01)
(52) U.S. Cl. ............. 307/10.1; 307/9.1; 307/121; 324/380; 324/378
(58) Field of Classification Search ............. 307/10.1, 307/9.1; 324/380
See application file for complete search history.

(56) References Cited

U.S. PATENT DOCUMENTS

| | | | |
|---|---|---|---|
| 5,977,653 A | 11/1999 | Schmid et al. | |
| 6,185,488 B1 | 2/2001 | Nomoto | |
| 6,320,448 B1 | 11/2001 | Gantioler | |
| 6,495,930 B1 * | 12/2002 | Hermann et al. | 307/10.1 |
| 6,628,007 B1 * | 9/2003 | Baumgartner | 307/10.1 |
| 6,696,840 B2 | 2/2004 | Ulmer | |

(Continued)

FOREIGN PATENT DOCUMENTS

DE   198 15 391 A1   10/1998

(Continued)

OTHER PUBLICATIONS

"Quad Firing Airbag IC: TLE 6714", Data Sheet V 1.61 Jul. 13, 2001, Infineon Technologies AG, 2001, pp. 1-10, (10 pages).

(Continued)

*Primary Examiner*—Vibol Tan
(74) *Attorney, Agent, or Firm*—Maginot, Moore & Beck

(57) ABSTRACT

Driving circuit for an ignition element of a passenger protection system

The present invention relates to a driving circuit for an ignition element of a passenger protection system which has the following features:

at least one first semiconductor component (HS; HS1, HS2) with a control connection (G) and a first and second load connection (D, S) and at least one second semiconductor component (LS; LS1, LS2) with a control connection (G) and a first and second load connection (D, S), at least one first and one second connection terminal (K2, K3; K21, K22, K31, K32) for connecting a load in series with the at least one first and at least one second semiconductor component the at least one first semiconductor component (HS; HS1, HS2) being integrated in at least one first semiconductor chip (IC1; IC11, IC12) and the at least one second semiconductor component (LS; LS1, LS2) being integrated in a second semiconductor chip (IC2) which are accommodated in a common package (PA) from which the at least one first connection terminal (K2; K21, K22) and the at least one second connection terminal (K3; K31, K32) are brought out.

18 Claims, 11 Drawing Sheets

U.S. PATENT DOCUMENTS

| | | | |
|---|---|---|---|
| 7,095,234 B2 * | 8/2006 | Ulmer et al. | 324/380 |
| 2002/0149374 A1 | 10/2002 | Ulmer | |

FOREIGN PATENT DOCUMENTS

| | | |
|---|---|---|
| DE | 199 34 559 C1 | 1/2001 |
| DE | 199 43 146 C1 | 1/2001 |
| DE | 101 18 457 A1 | 5/2002 |
| DE | 101 09 620 C1 | 6/2002 |
| DE | 101 22 191 | 8/2002 |
| DE | 101 12 414 A1 | 10/2002 |
| DE | 101 26 319 A1 | 2/2003 |
| WO | WO97/32757 A1 | 9/1997 |

OTHER PUBLICATIONS

Stengl/Tihanyi, "Leistungs-MOSFET-Praxis" [Practice of power MOSFETs], Pflaum Verlag, Munich, 1994, pp. 33-38, (6 pages).

* cited by examiner

DRIVING CIRCUIT FOR AN IGNITION ELEMENT OF A PASSENGER PROTECTION SYSTEM

FIELD OF THE INVENTION

The present invention relates to a driving circuit for an ignition element (squib) of a passenger protection system, for example, an airbag or a belt tightener.

BACKGROUND

Such a driving circuit is, for example, an integrated driving circuit of the TL6714 type by Infineon Technologies AG, Munich, which is described in the associated data sheet V 1.61 2001-07-13.

The ignition element driven by such a driving circuit is, for example, a pyrotechnic ignitor which initiates further processes for opening an airbag or for tensioning a safety belt. For safety reasons, the demand exists that such an ignitor must be separated from a supply voltage not only by a single switch element but that there must be at least two elements interrupting the current in the load circuit with the ignitor. Driving circuits for such ignitors must be designed for driving the ignitor with a predetermined ignition current which is, for example, within a range of between 1A and 3A for a predetermined on-period which is, for example, within the range of between 1 ms and 5 ms.

Known driving circuits for such ignition elements are constructed in such a manner that the two semiconductor components or semiconductor switches, with which the ignition element is connected in series, are integrated in a common semiconductor chip. In the case of multi-channel driving circuits such as, for example, the TLE6714, which are suitable for simultaneously driving a number of ignition elements, a number of first and second semiconductor switches are integrated on one chip, where one ignition element can be switched in each case between a first and a second semiconductor switch by external connections of the integrated circuit.

This integration of the semiconductor switches on a semiconductor chip leads to the possibility that an inadvertent deployment (IAD) of airbags or belt tighteners can occur in the case of a grave fault on the chip, for example triggered by an uncontrolled influence from the outside. The redundancy of the system, introduced by the two semiconductor switches connected in series with the ignition element, does not exist completely inasmuch as faults on the semiconductor chip which, for example, can lead to an unintended switching-on of a semiconductor switch, in many cases also lead to an unintended switching-on of the second semiconductor switch.

To avoid this disadvantage, it is known to provide two similar integrated driving circuits on one circuit board which allow a "cross-coupled connection" of the ignition elements as is shown in FIG. 1. In FIG. 1, the reference symbols IC10, IC20 designate two identically constructed driving circuits which in each case comprise a first semiconductor switch HS10, HS11 and a second semiconductor switch LS10, LS11, connections of these semiconductor switches in each case being conducted to the outside in order to switch via these connections an ignition element in series with the semiconductor switches HS10, LS10 and HS11, LS11, respectively. In the case of a cross-coupled circuit, it is then provided to use semiconductor switches of different driving circuits for driving an ignition element Z10, Z20. In the example shown, an ignition element Z10 is thus connected between the first semiconductor switch HS11 of the driving circuit IC20 switch HS11 of the driving circuit IC20 and the second semiconductor switch LS10 of the driving circuit IC10. Furthermore, a second ignition element Z20 is connected between the first semiconductor switch HS10 of the driving circuit IC10 and the second semiconductor switch LS11 of the driving circuit IC20. For driving the semiconductor circuit, there are driver circuits DH10, DL10, DH11, DL11, which can also fulfill protection functions for the semiconductor switches, provided in the individual driving circuits IC10, IC20.

The disadvantage of the arrangement shown in FIG. 1 is the comparatively complex wiring on the board, particularly in the case of multi-channel systems in which more than two ignitors are to be driven.

It is the aim of the present invention to provide a reliably operating driving circuit for an ignition element of a passenger protection system which does not have the above-mentioned disadvantages.

SUMMARY

This aim is achieved by a driving circuit for an ignition element according to the features of claim 1. Advantageous embodiments of the invention are the subject matter of the subclaims.

The driving circuit for an ignition element of a passenger protection system comprises at least one first controllable semiconductor component with a control connection and a first and second load connection and at least one second controllable semiconductor component with a control connection and a first and second load connection. The driving circuit also comprises at least one first and at least one second connection terminal for connecting a load in series with the at least one first and at least one second semiconductor component. For reliability reasons, it is then provided that the at least one first semiconductor component is integrated in at least one first semiconductor chip and the at least one second semiconductor component is integrated in a second semiconductor chip which are accommodated in a common package from which the at least one first connection terminal and the at least one second connection terminal are brought out for connecting the ignition element.

Accommodating the semiconductor chips with the first and second semiconductor switches in a common package simplifies the wiring on a board on which the driving circuit is used. Integrating the two semiconductor components or semiconductor switches, which are to be connected in series with an ignition element, on different semiconductor chips increases the reliability of the circuit, on the one hand, and, on the other hand, enables the two semiconductor chips to be implemented in different chip technologies which can lead to a further increase in reliability and moreover to cost advantages. During the operation of the driving circuit, one of the two semiconductor components is used as a high-side switch and then connected between the positive supply potential and the ignition element. The further semiconductor component is used as a low-side switch and is connected with its load path between the ignition element and the negative supply potential or reference potential, respectively. The loadings on these two semiconductor components during operation differ considerably which can be taken into consideration by using different chip technologies when these two semiconductor components are implemented.

It should be pointed out that the operation of the two semiconductor components which drive the ignitor of the passenger protection system can go beyond a mere switching function. Thus, in particular, the high-side switch can also be used in familiar manner for controlling the current flowing through the load and then fulfills the function of a current source, for the purpose of which this semiconductor component can assume more than only the two operating states of on and off. In the text which follows, the term semiconductor switch is, therefore, not meant as limiting to a component having only two switching states.

In this arrangement, the high-side component is constructed preferably as a vertical power MOSFET, the drain terminal of which is formed, for example, by the rear of the semiconductor chip in which the semiconductor switch is integrated. Such vertical power MOSFETs are described, for example, on pages 33 to 38 in Stengl/Tihanyi: "Leistungs-MOSFET-Praxis" [Practice of power MOSFETs], Pflaum Verlag, Munich, 1994. The gate terminal and the source terminal of this component are then available at the front of the semiconductor chip, and when a number of power MOSFETs are integrated in a common chip, the drain terminals of all semiconductor switches can be contacted jointly via the rear of the semiconductor chip whereas gate and source terminals are available separately for the individual semiconductor switches at the front. In such a chip with vertical power MOSFET, logic components can also be integrated in a self-isolating manner. In the case of an n-type MOSFET, p-doped wells starting from one of the sides are incorporated for this purpose in the semiconductor chip and the logic components can be implemented in these p-doped wells.

The low-side component or the low-side switch, respectively, which can also perform a current regulating function in familiar manner, is preferably implemented in BCD technology. In this technology, for example, n-doped wells in which the individual components are implemented are created in a p-doped substrate starting from one of the sides. During the operation of the circuit, the most negative potential occurring in the circuit is applied to the p substrate in order to isolate the components from one another in various n-doped wells.

In an embodiment of the invention, it is provided that a number of first semiconductor switches which are in each case integrated in the first semiconductor chip, and a number of second semiconductor switches which are in each case integrated in the second semiconductor chip are present. In this manner, an inexpensive multi-channel driving circuit can be implemented.

In an embodiment having at least two channels in which at least two first semiconductor switches and at least two second semiconductor switches are therefore present, it is provided that at least one of the first semiconductor switches and at least one other of the first semiconductor switches are integrated in different semiconductor switches which are integrated together with the second semiconductor chip in the common package. Assuming that the second semiconductor switches integrated in the second semiconductor chip are low-side switches which are between a respective ignition element and reference potential during the operation of the circuit, there is a possibility in such an embodiment to provide two different supply potentials for the individual ignition elements, namely a first supply potential for a first channel with the one of the first semiconductor switches and a second supply potential for a second channel with the other of the first semiconductor switches.

The at least one first semiconductor chip is preferably mounted on a first electrically conductive support plate and the second semiconductor chip is mounted on a second electrically conductive support plate, the electrically conductive support plates being arranged spaced apart from one another on an electrically insulating plate. If the at least one first semiconductor chip contains a vertical power MOSFET, there is the possibility in this embodiment to apply the rear of this first semiconductor chip electrically conductively to the support plate so that the support plate enables the drain terminal of the power MOSFET or power MOSFETs integrated in the first semiconductor chip to be contacted. If the second semiconductor chip is implemented in BCD technology, in which the semiconductor substrate must be connected to the most negative potential occurring in the circuit even during operation, this semiconductor substrate in this embodiment can be connected in a simple manner to reference potential via the second support plate in order to meet this requirement.

As protection against external influences, the arrangement with the semiconductor chips and the support plates is surrounded by an electrically insulating package from which only connections for connecting one or more ignition elements and connections for signal inputs or signal outputs protrude.

The driving circuit preferably comprises an interface circuit, integrated on one of the semiconductor chips, for supplying a driving signal for the semiconductor switches. This interface circuit is constructed, in particular, as serial/parallel interface (SPI) which provides from a serial driving signal a number of parallel driving signals for the semiconductor switches, namely both for the semiconductor switches which are located on the same semiconductor switch as the interface circuit and for the semiconductor switches which are located on the other semiconductor chip or the o-other semiconductor chips. This embodiment provides the advantage that the package of the driving circuit only needs to have one input for supplying a driving signal whereas the driving signals to the individual semiconductor switches are supplied internally in the package.

For safety reasons, it is provided in one embodiment that the at least one other semiconductor chip on which the interface circuit is not arranged is supplied with an enable signal for the semiconductor switches arranged on this semiconductor switch. In this arrangement, logic components are provided on this semiconductor chip which combine the driving signals supplied by the interface circuit for the semiconductor switches arranged on the chip and the enable signal with one another and which ensure that the semiconductor switches on this chip can only be driven when the enable signal has a predetermined level.

In a further embodiment of the invention, it is provided that, in series with the at least one first semiconductor switch, a diode is connected which blocks a current from the ignition element in the direction of the voltage supply when the driving circuit is in operation. This diode is integrated in a third semiconductor chip which is accommodated in the common package with the at least one first semiconductor chip and the second semiconductor chip. In one embodiment, it is provided that the at least one first semiconductor chip and the third semiconductor chip are mounted on a common circuit board which connects the at least one first semiconductor switch and the diode to one another in an electrically conductive manner. In this case, the at least one first semiconductor switch and the diode are constructed as vertical components, that is to say as components in which one side of the semiconductor chip in which the components are integrated forms a component connection, the chips being mounted on the conductive support with this side.

BRIEF DESCRIPTION OF THE DRAWINGS

In the text which follows, the present invention will be explained in greater detail in exemplary embodiments with reference to figures, in which.

DETAILED DESCRIPTION

Unless otherwise specified, identical reference symbols designate identical parts with identical meaning in the figures.

Figure 1:
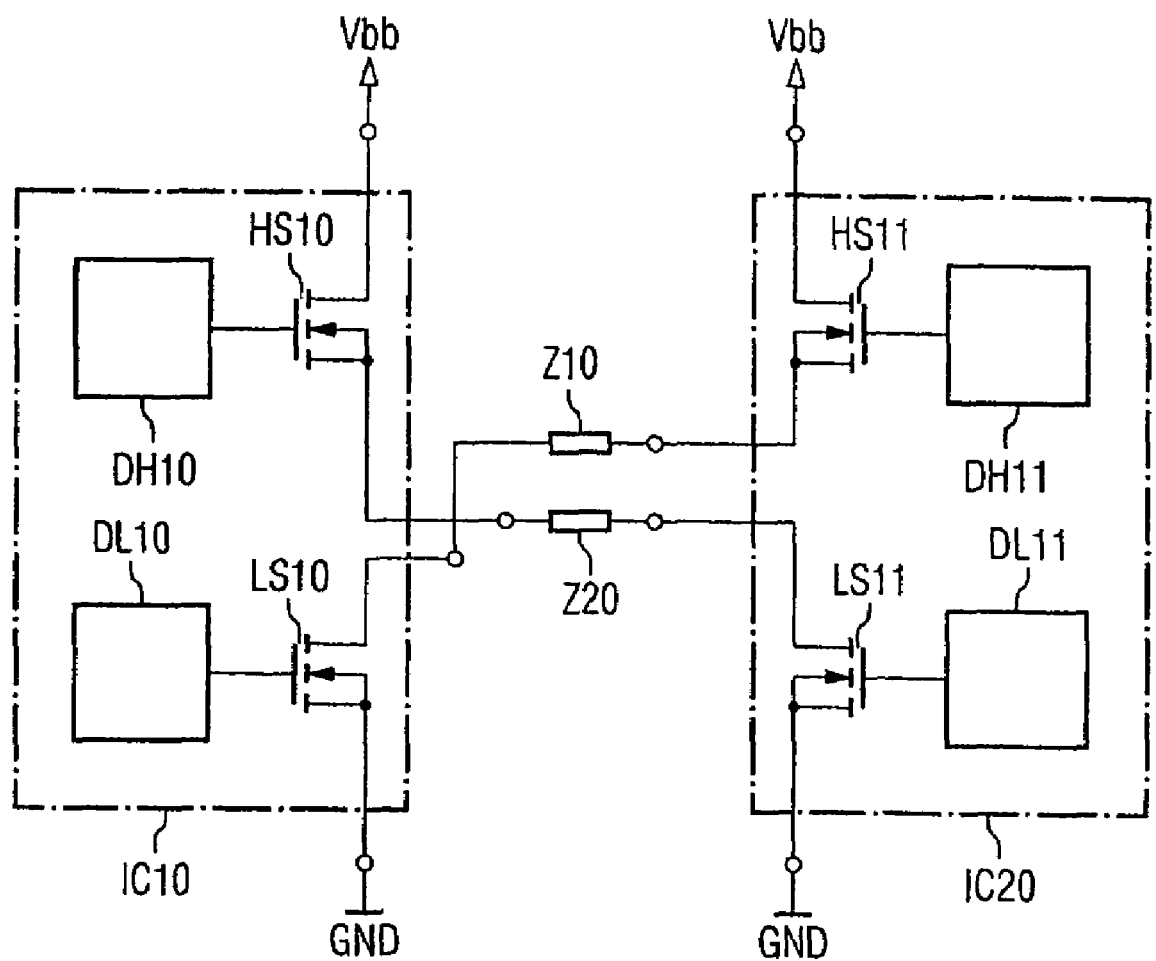
FIG. 1 shows a driving circuit of the prior art which comprises two identically constructed cross-coupled circuit components.
Figure 2:
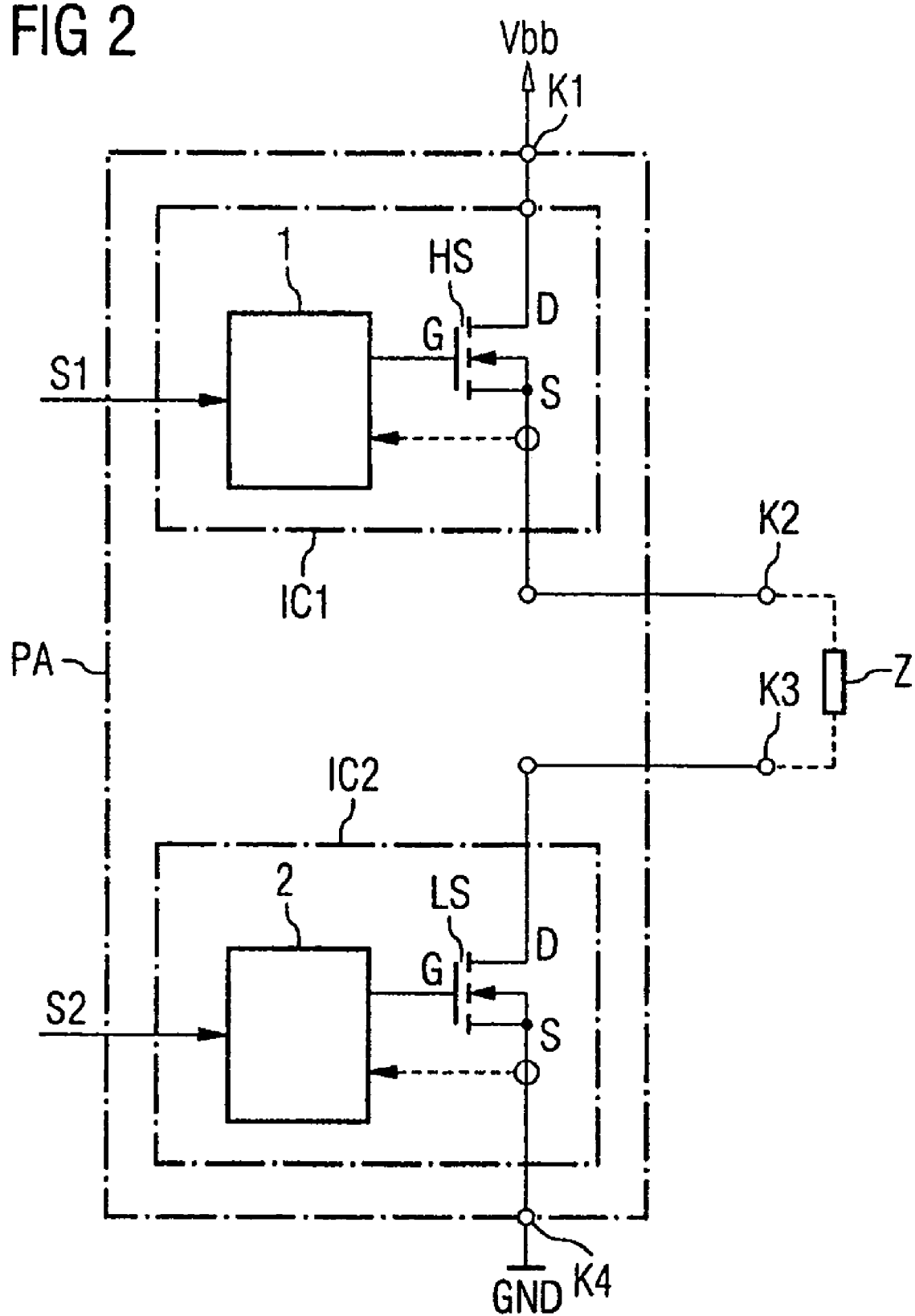
FIG. 2 shows a first exemplary embodiment of a driving circuit according to the invention at circuit level.

FIG. 2 shows a circuit-level exemplary embodiment of a driving circuit according to the invention which comprises a first semiconductor component or semiconductor switch HS used as high-side switch in operation and a second semiconductor component or semiconductor switch LS used as low-side switch in operation. The semiconductor switches HS, LS are in each case constructed as transistors, as n-channel MOSFET in the example, the drain and source terminals of which form the load terminals of the semiconductor switches HS, LS and the gate terminals of which form the driving terminals. The load path D-S of the first semiconductor switch HS is connected between a first connection terminal K1 for connecting a supply potential Vbb and a second connection terminal K2 for connecting an ignition element Z shown dashed in FIG. 2. The load path D-S of the second semiconductor switching element LS is connected between a third connection terminal K3 for connecting the ignition element Z and a fourth connection terminal K4 for connecting to a negative supply potential or reference potential GND. The two semiconductor switches HS, LS are integrated in different semiconductor chips IC1, IC2, shown dot-dashed in FIG. 2, the two semiconductor chips IC1, IC2 being accommodated in a common package PA which is shown dashed in FIG. 2. Said common package can be a conventional molded chip package. For driving the semiconductor switches HS, LS, control circuits 1, 2 are in each case provided which drive the semiconductor switches HS, LS in each case as determined by driving signals S1, S2 in order to be able to fire the ignition element Z set by this means. The driving signals S1, S2 can be generated in any manner. In the exemplary embodiment in FIG. 2, the driving signals S1, S2 are in each case supplied to the control circuits 1, 2 from the outside. In a manner not shown in greater detail in FIG. 2 but explained in the text which follows, it is also possible to supply one or more driving signals for the two semiconductor switches to only one control circuit on one chip IC1 or IC2 and to forward the driving signal for the semiconductor switch internally in the package, for example via bonding wires, on the other chip in each case.

The function of the high-side switch HS and of the low-side switch LS can go beyond a mere switch function. Thus, both the high-side switch HS and the low-side switch LS can be part of a current regulating arrangement known in principle for this application and, therefore, not shown in greater detail, which, for driving the ignition element Z, controls the current flowing through the ignition element Z to a specified current required for the ignition element Z to fire. To control this current, the load current through the respective transistor HS, LS is determined and supplied to the driving circuit 1, 2 which is shown dashed in FIG. 2. The current can be sensed in any manner, particularly by using a sensing transistor not shown in greater detail.

The advantage of integrating the two semiconductor switches HS, LS on different semiconductor chips IC1, IC2 consists in that an increased reliability is achieved by separating the integrated circuits. In addition, it is possible to implement the semiconductor switches HS, LS in different semiconductor technologies in order to meet by this means the different requirements for the high-side switch HS and the low-side switch LS during operation. Thus, for example, it is possible to implement the high-side switch in a sufficiently well-known manner as a vertical power MOSFET, it being possible to integrate the control circuit 1 on the same chip. Naturally, it is also possible to integrate the control circuit 1 in a separate chip and to mount it in chip-on-board technology on the semiconductor chip with the power MOSFET. The low-side switch LS is preferably implemented in the sufficiently well-known BCD technology and it is also possible in this case to integrate the power MOSFET and logic components on one common chip.

Figure 12:
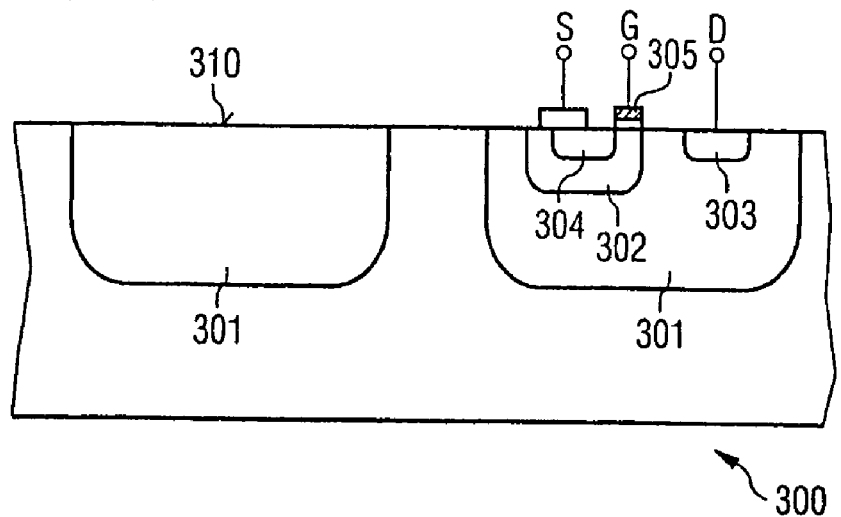
FIG. 12 shows an example of a circuit arrangement in BCD technology.

FIG. 12 diagrammatically shows a semiconductor chip with circuit components which are implemented in BCD technology. The chip comprises a semiconductor body 300 which has p-type bulk doping. Starting from a front 310, n-doped wells 301, in which both lateral logic components and lateral and vertical power components can be implemented, are incorporated in this semiconductor body 300. As an example, FIG. 12 shows a lateral MOS transistor which is formed in one of the n-doped wells 301. This transistor comprises a p-doped body zone 302 in which an n-doped source zone 304 is arranged which is contacted by a source terminal. At a distance from the source zone, an n-doped drain zone 303 is arranged in the n well 301. Insulated from the semiconductor body 300 and adjacently to the body zone 302, a gate electrode 305 is provided for controlling a channel between the source zone 304 and the well 301 forming the drift zone of the component. In a vertical power component in BCD technology, not shown in greater detail, one of the connection zones, for example a drain zone in a MOSFET, is formed by a buried semiconductor layer which is brought to the front at one place.

Correspondingly, arbitrary bipolar circuit structures, CMOS circuit structures or DMOS circuit structures can be implemented in the n-doped wells.

Figure 13:
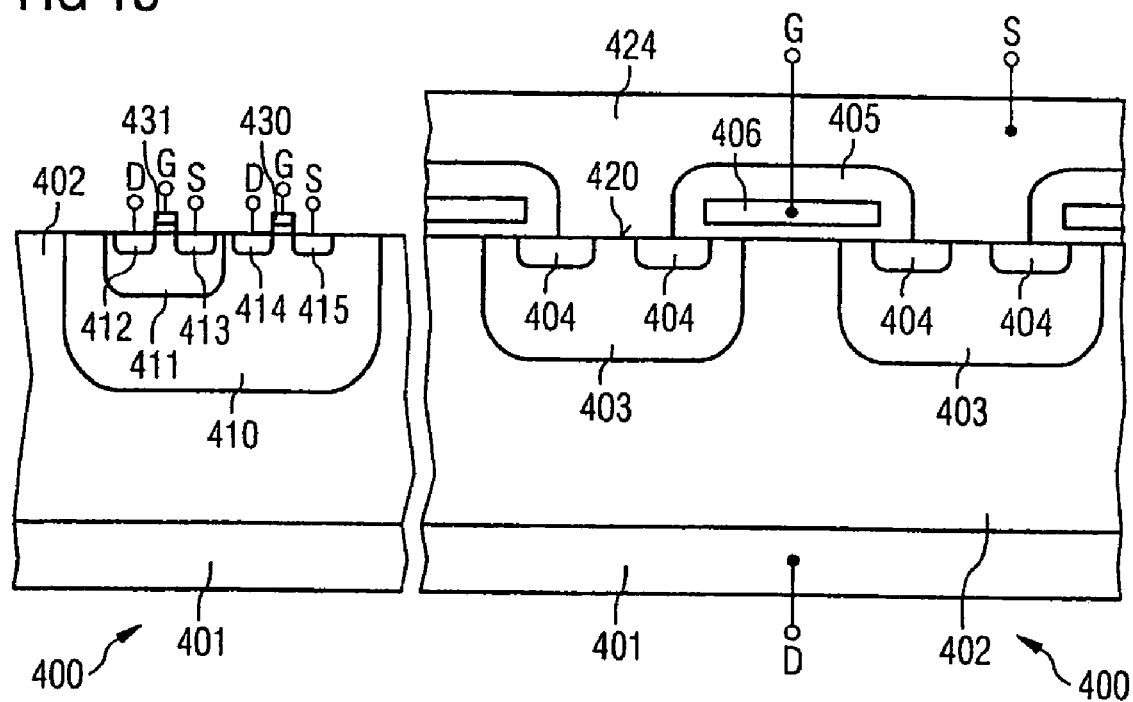
FIG. 13 shows an exemplary embodiment of a semiconductor chip with a vertical power MOSFET and a logic circuit arranged on the chip.

FIG. 13 diagrammatically shows a semiconductor chip with a vertical power MOSFET and logic components integrated on the chip. The chip comprises a semiconductor body 400 with a semiconductor substrate 401 and a semiconductor layer 402 with weaker doping which is applied to the former. In this semiconductor layer 402, body zones 403 of a type of conduction complementary to the semiconductor layer 402 are incorporated starting from a front end. In the case of an n-type MOSFET, the substrate 401 and the semiconductor layer 402 are n-types whereas the body zones 403 are p-types. In these body zones 403, source zones 404 doped in complementary manner to the body zones 403 are incorporated which are contacted by a source electrode 424. Insulated from the semiconductor body 400, gate electrodes 406 are provided which are arranged adjacently to the body zones 403 in order to control a conductive channel between the source zones 404 and the semiconductor layer 402 forming the drift path of the component in the body zones 403. In the case of a conductively driven gate electrode 406, a current flows essentially in the vertical direction in the component, the semiconductor substrate 401 forming the drain terminal of the component. The component is constructed in the manner of cells and comprises a multiplicity of similarly constructed and parallel-connected transistor cells.

Spaced apart from the cell array, logic components are integrated in the semiconductor chip which are arranged in wells 410 doped in complementary manner to the semiconductor layer 402. FIG. 13 shows by way of example two complementary transistors integrated in such a well 410. A first transistor comprises drain and source zones 414, 415, which are arranged spaced apart from one another in the lateral direction, which are doped in complementary manner to the well 410. A conductive channel between source zone and drain zone 415, 414 is controlled by a gate electrode 430 arranged above the semiconductor body.

A further transistor is arranged in a well 411 doped in complementary manner to the well 410, this transistor having source and drain zones 413, 412, complementary to the source and drain zones of the first transistor, which are arranged spaced apart from one another in the lateral direction. A conductive channel between these source and drain zones 413, 412 is controlled by a gate electrode 431.

Correspondingly, further bipolar or CMOS structures can be arbitrarily integrated on this semiconductor chip for creating a logic structure.

Figure 3:
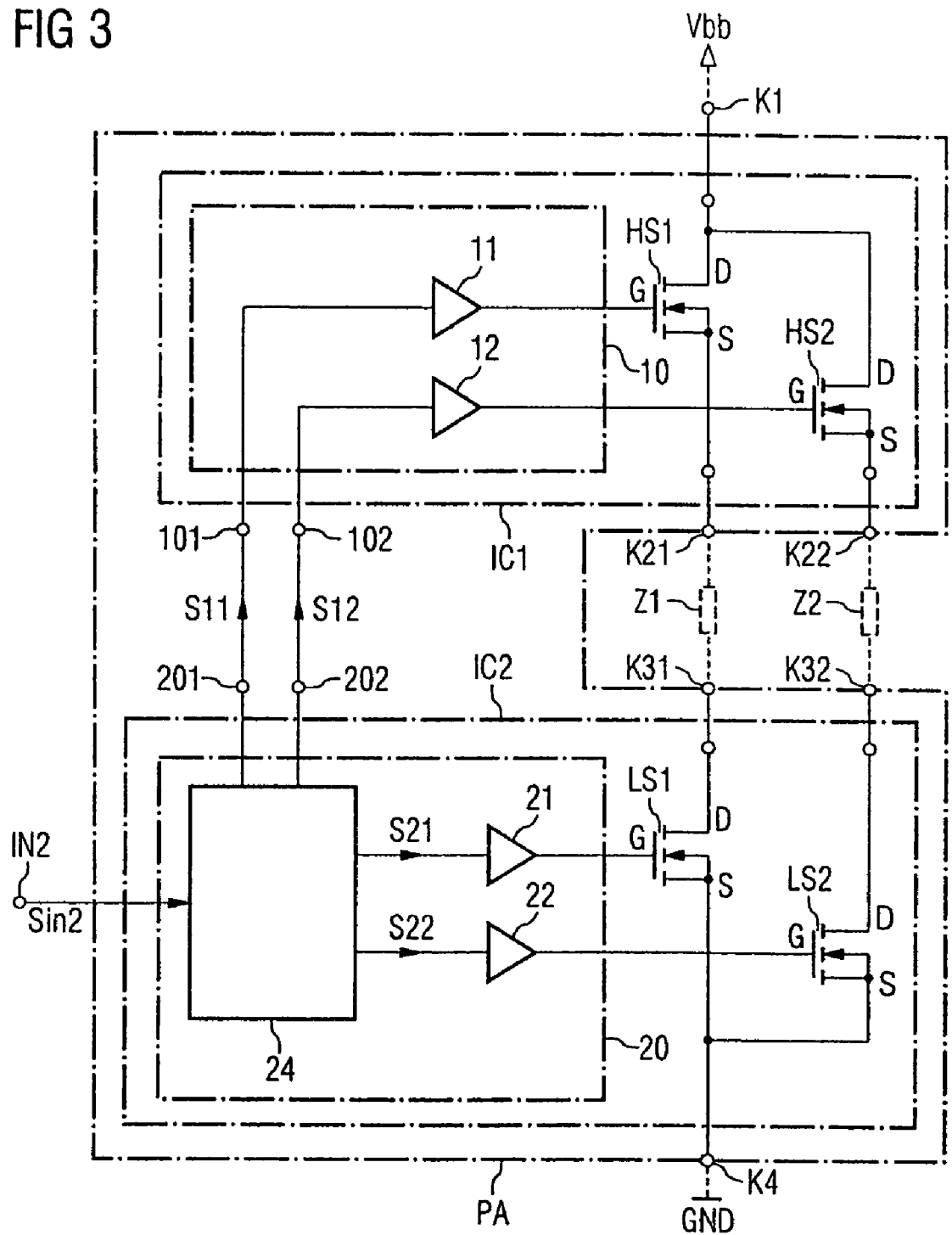
FIG. 3 shows a second exemplary embodiment of a driving circuit according to the invention at circuit level.

FIG. 3 shows a further exemplary embodiment of a driving circuit according to the invention which in the example is implemented as a two-channel circuit which thus has two first semiconductor switches HS1, HS2 in a first semiconductor chip IC1 and two second semiconductor switches LS1, LS2 in a second semiconductor chip IC2. The semiconductor switches HS1, HS2, LS1, LS2 are also constructed as n-type MOSFETs in this exemplary embodiment. The drain-source paths of the first semiconductor switches HS1, HS2 used as high-side switches are connected between a first connection terminal K1 to which the drain terminals of the MOSFETs HS1, HS2 are jointly connected and between in each case one of two second connection terminals K21, K22, the source terminal of in each case one of the semiconductor switches HS1, HS2 being connected to one of these connections K21, K22. These connections K21, K22 are used for connecting ignition elements Z1, Z2 which are shown dashed in FIG. 3. The drain-source paths of the low-side MOSFETs LS1, LS2 are connected between a fourth connection terminal K4 and in each case one of two third connection terminals K31, K32, the drain terminals D of MOSFETs LS1, LS2 in each case being connected to one of the third connections K31, K32. These third connections K31, K32 are used for connecting the ignition elements Z1, Z2, in such a manner that in each case one ignition element is connected in series with one of the first semiconductor switches HS1, HS2 and one of the second semiconductor switches LS1, LS2. As shown diagrammatically in FIG. 3, the first and fourth connection terminal K1, K4 are brought out of a package PA, shown dashed, which surrounds the two semiconductor chips IC1, IC2, for connecting a supply potential or reference potential, and the second and third connection terminals K21, K22, K31, K32 are brought out for connecting the ignition elements Z1, Z2.

In each case, control circuits 10, 20 are provided on the semiconductor chips IC1, IC2 for driving the individual semiconductor switches HS1, HS2, LS1, LS2. The control circuit 20 on the second semiconductor chip IC2 comprises an interface circuit 24, the input of which is connected to an input connection IN2, brought out of the package PA for supplying a driving signal Sin2. This interface circuit 24 is constructed as serial/parallel interface (SPI) which is used for converting a driving signal Sin2 which comprises the driving information for the individual semiconductor switches HS1, HS2, LS1, LS2 in serially coded manner, into parallel driving signals S11, S12, S21, S22 for the individual semiconductor switches HS1, HS2, LS1, LS2. Such SPI interfaces are sufficiently well-known so that no further explanations are needed in this respect. The interface circuit 24 provides both driving signals S21, S22 for the low-side switches LS1, LS2 on the same chip IC2 and driving signals S11, S12 for the high-side switches HS1, HS2 on the other chip IC1, the latter driving signals S11, S12 being transferred to the chip IC1 internally in the package as will still be explained by means of FIG. 4 in the text which follows. To transfer these signals, the chip IC2 with the interface circuit 24 and the other chip IC1 have connections 201, 202, 101, 102 via which a signal exchange can take place between the two chips IC1, IC2.

To convert the driving signals S21, S22, S11, S12 supplied by the interface circuit 24 to levels suitable for driving the respective semiconductor switches LS1, LS2, HS1, HS2, driver circuits 21, 22, 11, 12 are in each case provided which are in each case connected in series with the driving connections G of the semiconductor switches HS1, HS2, LS1, LS2.

Figure 4:
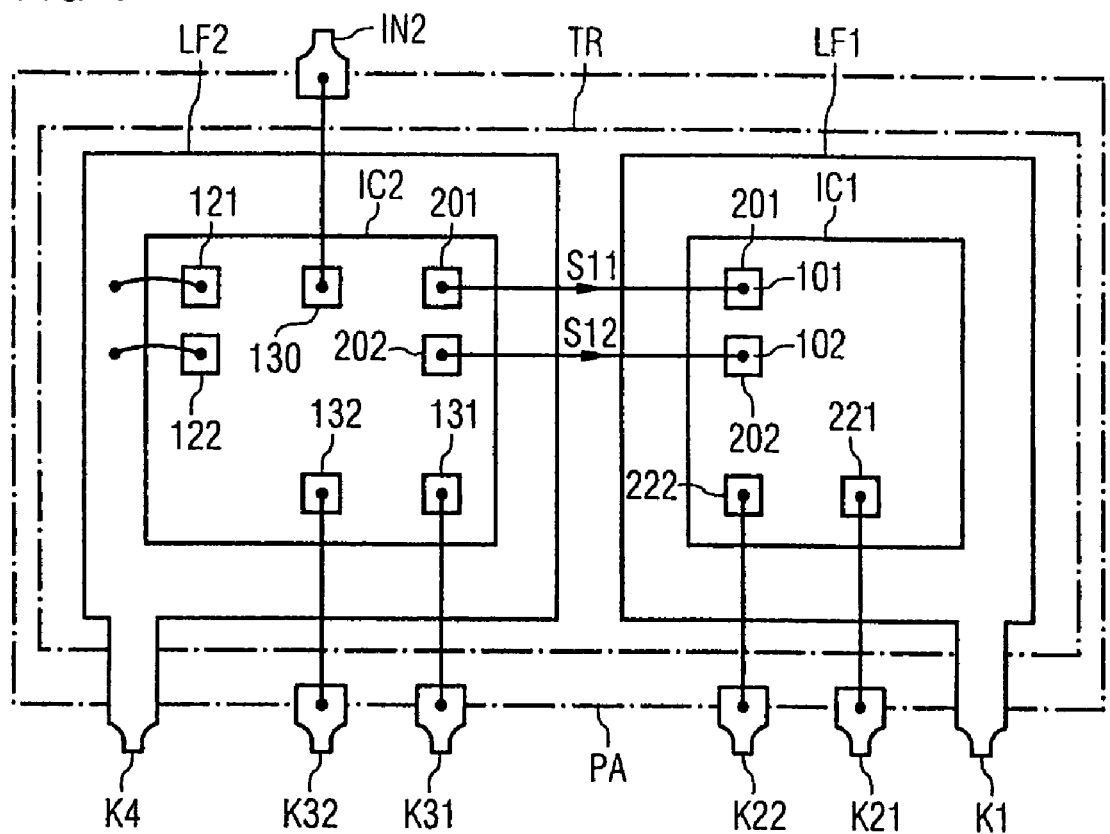
FIG. 4 shows a top view of a circuit module with two semiconductor chips in which a circuit according to FIG. 3 is integrated.
Figure 5:
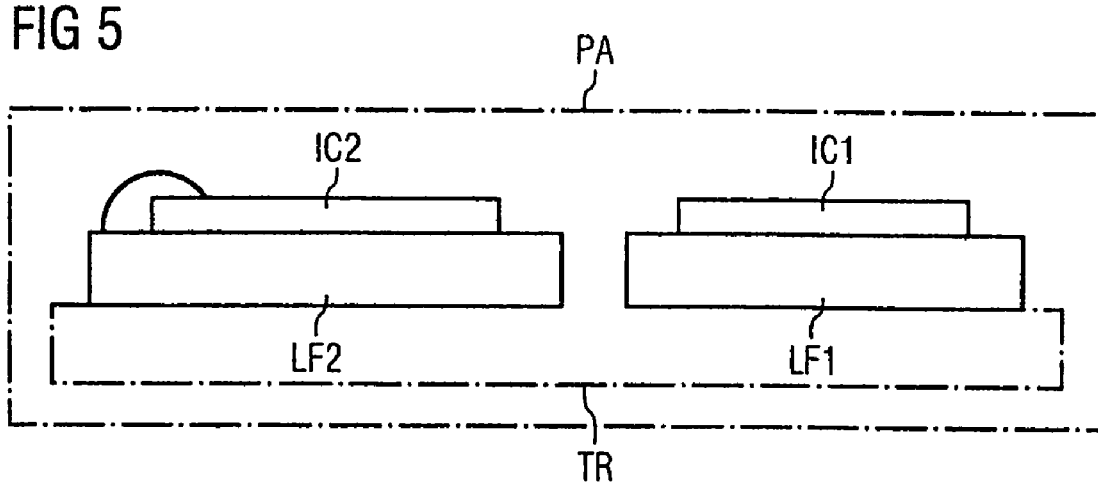
FIG. 5 shows the module according to FIG. 4 in a side view.

FIG. 4 shows a top view of a semiconductor module with two semiconductor chips IC1, IC2, in which a driving circuit according to FIG. 3 is integrated. To provide a better understanding, identical functional elements carry identical reference symbols. FIG. 5 shows the semiconductor module according to FIG. 4 in a side view.

The two semiconductor chips IC1, IC2 are in each case mounted with their rear on an electrically conductive support or lead frame and these supports LF1, LF2 can be arranged on an electrically insulating support plate TR, for example a ceramic substrate which is shown dot-dashed in FIGS. 4 and 5. The arrangement with the electrically insulating support TR and the electrically conductive support LF1, LF2 can then be constructed as a so-called DCB (Direct Copper Bonding) substrate.

In the semiconductor module according to FIGS. 4 and 5, the first semiconductor switches (HS1, HS2 in FIG. 3) are constructed as vertical power MOSFETs which have a common drain terminal which is formed by the rear of the first semiconductor chip IC1. To contact these drain terminals, a connection leg K1 is provided which is arranged of one piece at the lead frame LF1 in the example. When a DCB substrate is used, the lead frame LF1 and the connection leg K1 can also be constructed separately from one another in a manner not shown and then connected by means of a bonding wire. The connection leg K1, like connection legs still described in the text which follows, protrudes from the package PA which consists of an electrically insulating material and which surrounds the arrangement with the semiconductor chips IC1, IC2 and the lead frames LF1, LF2. On the front facing away from the lead frame LF1, of the first semiconductor chip IC1, there are a number of connection contacts 201-222, connection contacts 221, 222 being used for contacting the source terminals S of the first semiconductor switches HS1, HS2. These source terminals are connected via bonding wires to two connection legs K21, K22 which form the second connection terminals of the semiconductor module. The further connection areas 101, 102 are used for receiving the driving signals from the second chip IC2 as has already been explained by means of FIG. 3.

The second semiconductor chip IC2 is preferably implemented in BCD technology. The rear of this semiconductor chip IC2 is connected via lead frame LF2 to a connection leg representing the fourth connection terminal K4 which, in the example, is molded of one piece with the lead frame and to which the reference potential GND is applied during operation. This ensures that the semiconductor substrate of the second semiconductor chip IC2 is always at the most negative potential occurring in the circuit. On the front facing away from the second lead frame LF2, of the second semiconductor chip, there are a number of connection areas. Connection areas 131, 132 form drain terminals of the MOSFETs integrated in the semiconductor chip IC2. These connection areas 131, 132 are connected to connection legs which form the third connection terminals K31, K32 of the semiconductor module.

On the front of the semiconductor chip IC2, there are also connection areas 121, 122 for the source terminals of the MOSFETs (LS1, LS2 in FIG. 3). These source terminals 121, 122 are bonded directly to the second lead frame LF2 and are thus at reference potential via the fourth connection terminal K4 during operation.

Furthermore, connection areas 201, 202 are provided which are used for transferring the driving signals S11, S12, generated in the second chip IC2, for the semiconductor switches HS1, HS2 on the first semiconductor chip IC1. To supply the serial driving signal Sin2, a further connection area 130 is provided which is coupled to a further connection leg IN2 which forms the signal input of the semiconductor module.

Naturally, the driving circuit shown in FIGS. 3 to 5 can be expanded in a simple manner to more than two channels by providing further first and second semiconductor switches and corresponding driver circuits and by constructing the interface circuit for providing from the input signal a number of driving signals corresponding to the number of semiconductor switches.

Figure 14:
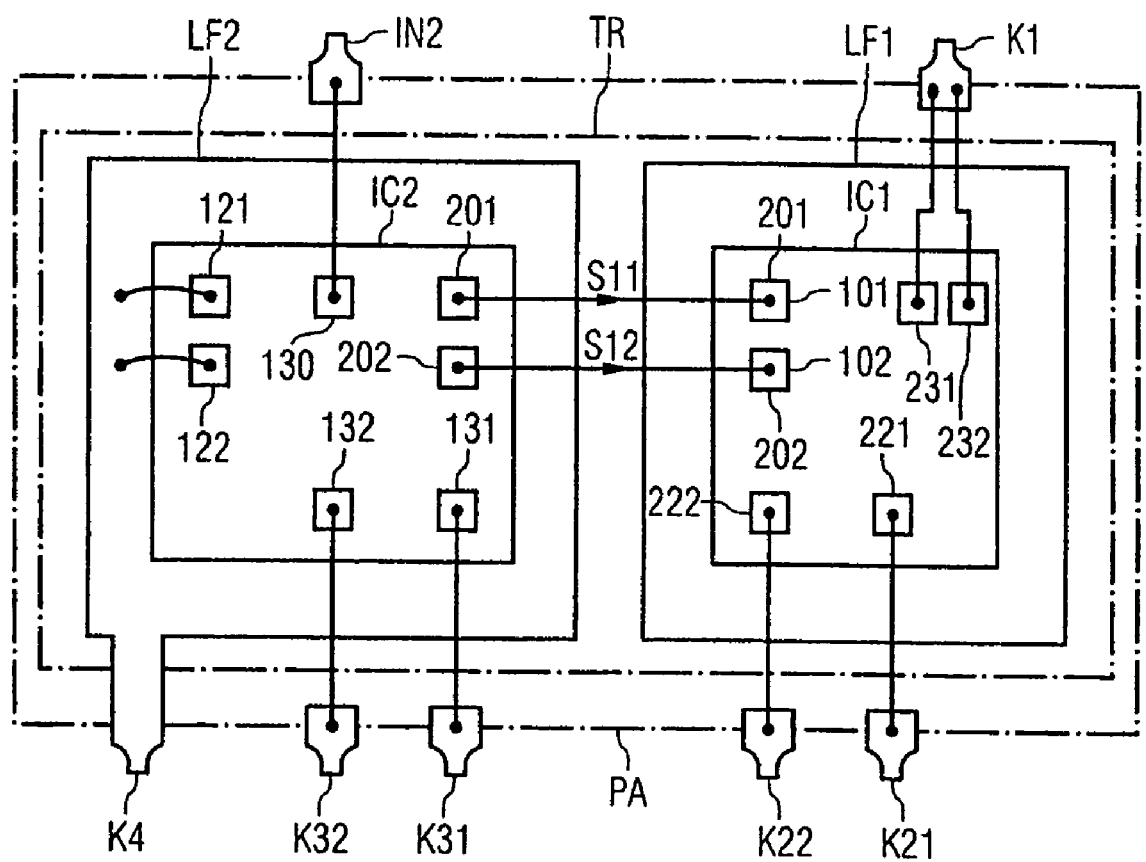
FIG. 14 shows a top view of a semiconductor module in which both semiconductor chips are constructed in BCD technology.

Apart from the second semiconductor chip IC2, the first semiconductor chip IC1 can also be constructed in BCD technology, referring to FIG. 14. The drain terminals of the MOSFETs constructed in the semiconductor chip IC1 can be contacted via connection contacts 231, 232 on the front of the semiconductor chip IC1, these connection contacts 231, 232 being connected via bonding wires to the connection leg K1, representing the common drain terminal of the component, in the example. Naturally, it is also possible to provide one connection leg per drain terminal and, depending on the internal structure of the chip IC1, only one connection contact can be provided, if necessary, as a common drain terminal for the integrated MOSFETs.

The first semiconductor chip IC1, together with the second semiconductor chip IC2, is arranged on a common lead frame LF2. This lead frame LF2 is connected to reference potential GND via the connection leg K4 in the manner explained, in order to ensure that the semiconductor substrates of the first and second semiconductor chip IC1, IC2 are always at the most negative potential occurring in the circuit.

In the driving circuit explained above, the driving signals for all semiconductor switches HS1, HS2, LS1, LS2 are provided from the input signal Sin2 by the interface circuit 24, the driving signals for the semiconductor switches HS1, HS2 being transferred to the other semiconductor chip IC1 between connection areas 201, 101 and 202, 102, respectively, of the semiconductor chips IC2, IC1 via connecting lines, particularly bonding wires, internally in the package.

For safety reasons, it is provided in an exemplary embodiment shown in FIG. 6 to supply the first semiconductor chip IC1, on which the interface circuit 24 is not arranged, with an enable signal Sin1 at an input terminal IN1 as will be explained in the text which follows. The remaining parts of the circuit according to FIG. 6 correspond to those of the circuit according to FIG. 3 so that these will not be described again in order to avoid repetitions.

Figure 6:
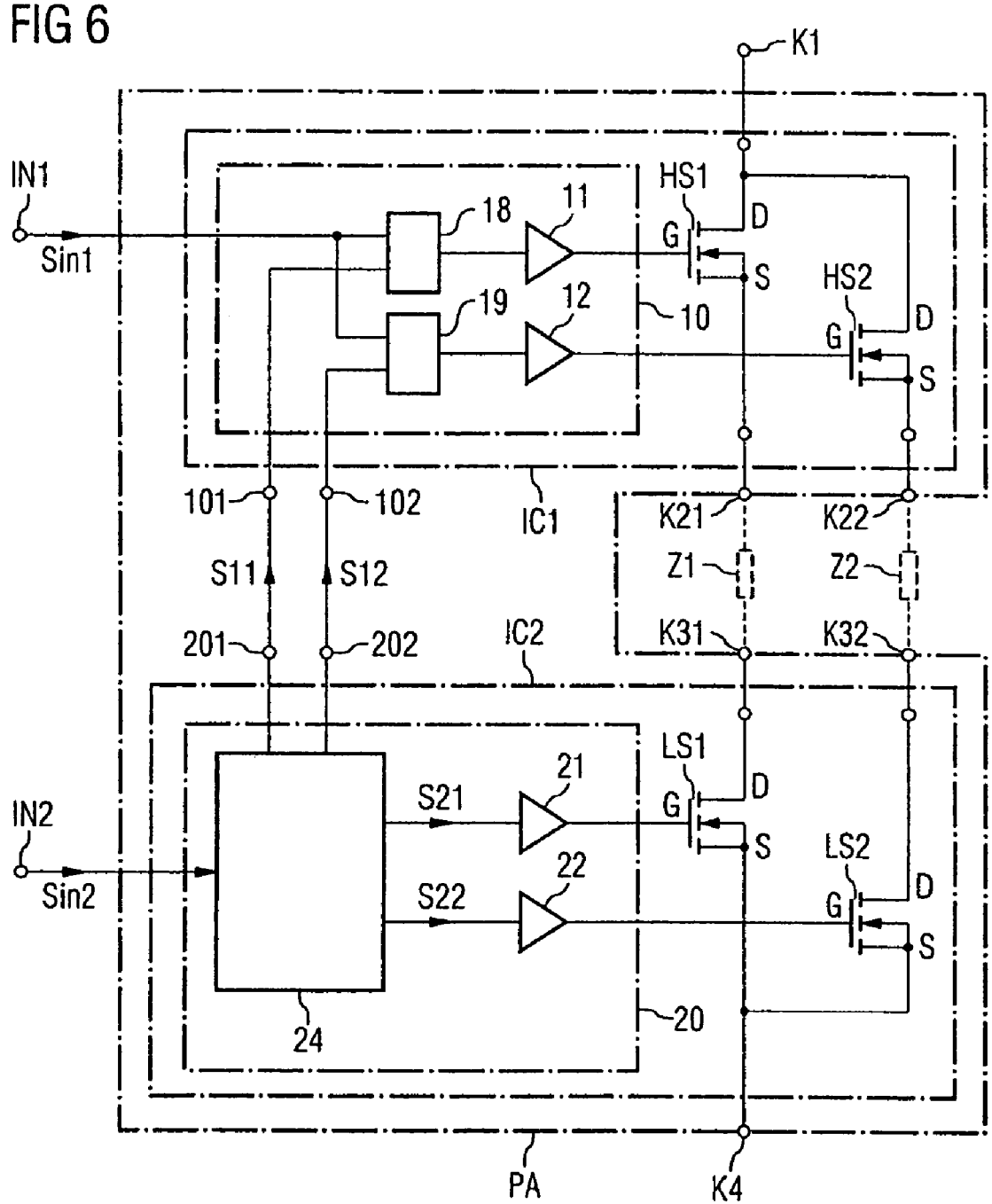
FIG. 6 shows a modification of the circuit shown in FIG. 3 at circuit level.

The control circuit 10 on the first semiconductor chip IC1 of the circuit arrangement in FIG. 6 comprises logic elements 18, 19 by means of which in each case one of the driving signals S11, S12, supplied by the interface circuit 24, and the enable signal Sin1 are combined. The logic elements 18, 19 are constructed in such a manner that they provide at their output a signal with which the respective first semiconductor switch HS1, HS2 is cut off when the enable signal Sin1 has a predetermined first level. If the enable signal Sin2 has a predetermined second level which enables the semiconductor switches HS1, HS2 for driving, the logic elements 18, 19 allow the driving signals S11, S12 to pass for driving the semiconductor switches HS1, HS2.

It shall be assumed as an example that the first semiconductor switches HS1, HS2 are enabled with a High level of the enable signal Sin1 and that the high-side switches HS1, HS2 are intended to conduct with a High level of the output signal of the logic circuits 18, 19 or of the driving signals S11, S12, respectively. In this case, the logic elements 18, 19 are constructed as AND gates.

Figure 7:
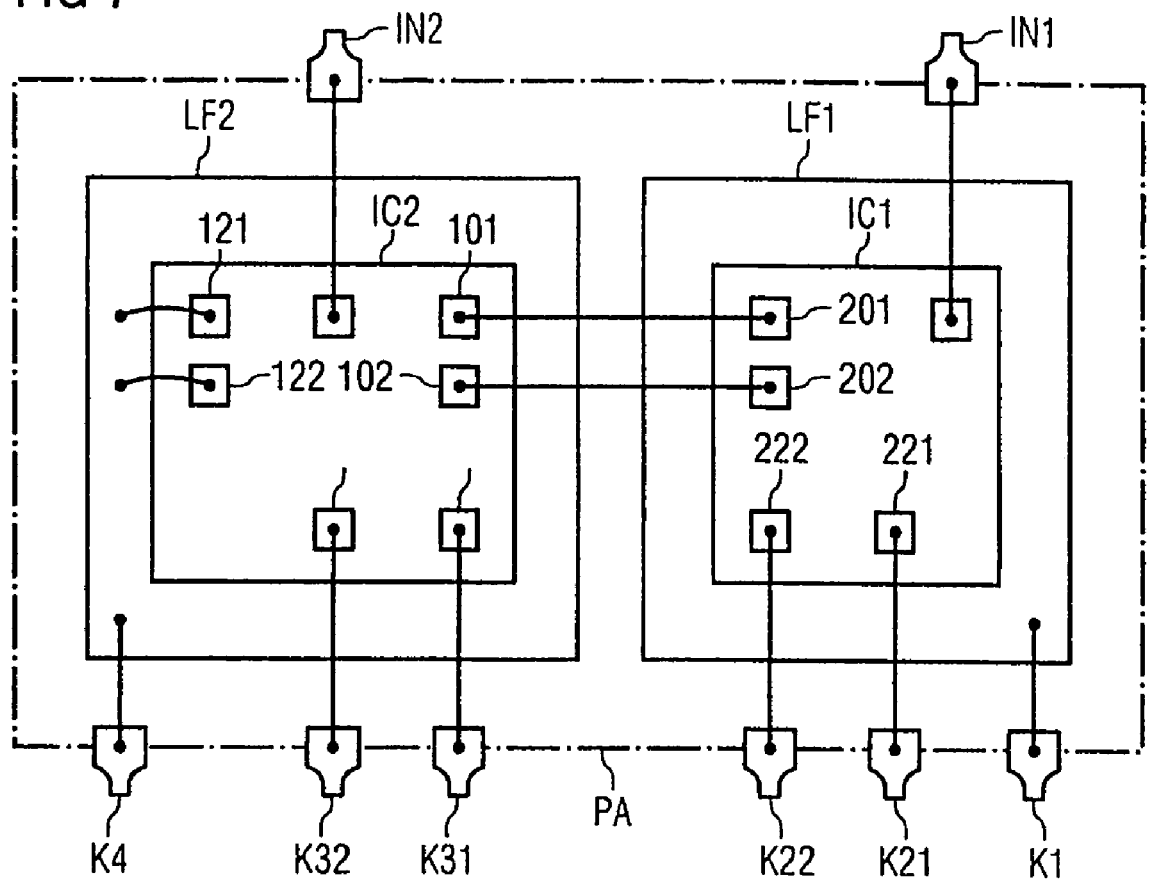
FIG. 7 shows a top view of a semiconductor module with two semiconductor chips in which the circuit according to FIG. 6 is integrated.

FIG. 7 shows a semiconductor module with two semiconductor chips IC1, IC2 in which the circuit according to FIG. 6 is integrated. This semiconductor module differs from the semiconductor module shown in FIGS. 4 and 5 by an additional connection area 230 of the first semiconductor chip IC1 and by an additional connection leg IN1 for supplying the enable signal Sin1, this connection leg IN1 being connected to the connection area 230 which is internally coupled to the logic elements in the semiconductor chip IC1.

There are application circuits in which driving circuits for ignition elements are used and in which a current flow from the ignition element in the direction of the supply potential must be prevented. Since the power MOSFETs usually used as high-side switches have an integrated reverse diode because of the internal short circuit of source region and body region, these high-side switches cannot prevent current flow from the ignition element to the supply potential.

Figure 8:
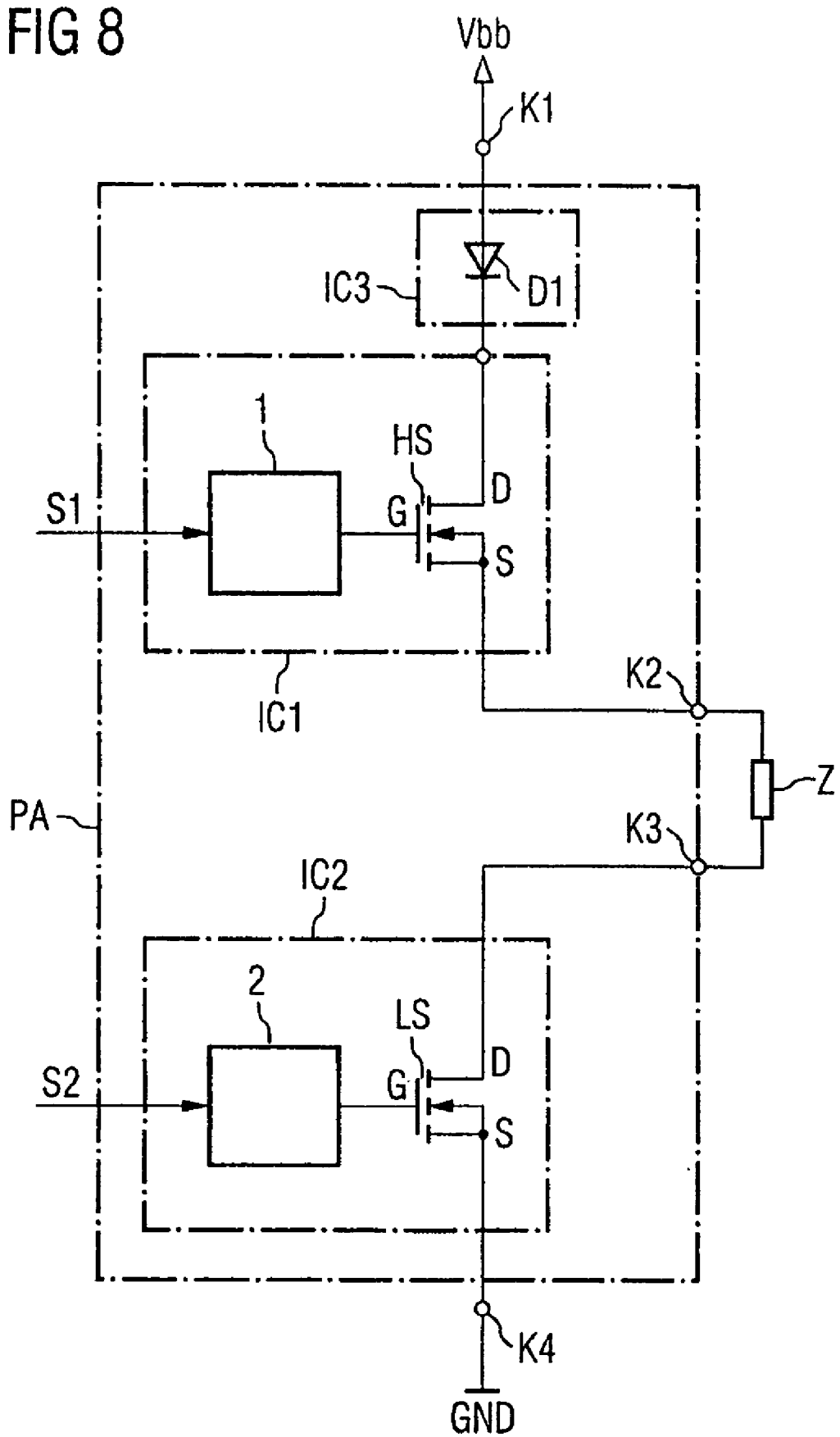
FIG. 8 shows a further development of the circuit according to FIG. 2 which additionally comprises a polarity reversal protection diode.
Figure 9:
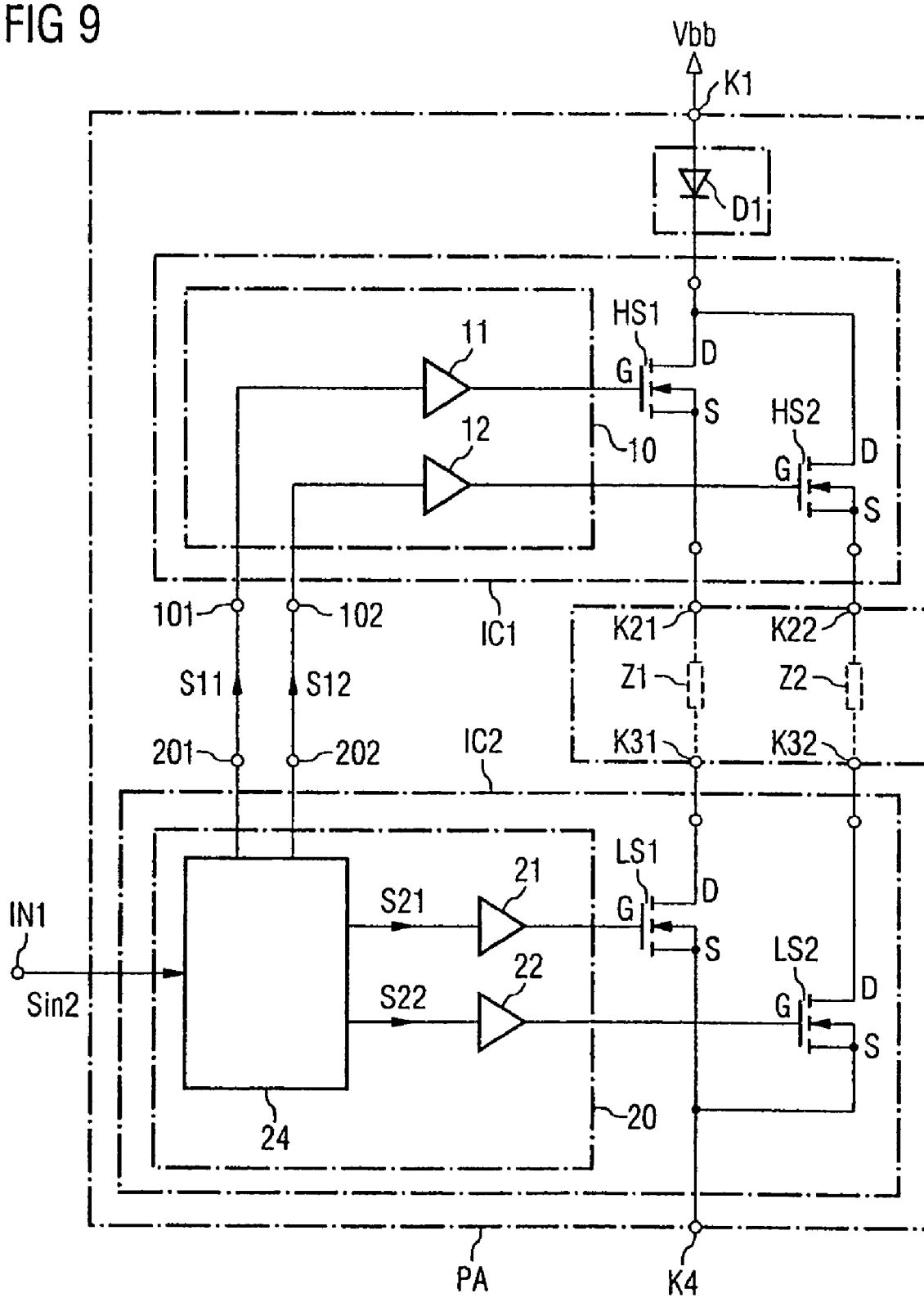
FIG. 9 shows a further development of the circuit according to FIG. 3 with a polarity reversal protection diode.

This is remedied by a diode D1 which is connected between the first connection terminal K1 for supply potential Vbb and the first semiconductor switch or switches HS, HS1, HS2, referring to the exemplary embodiments in FIGS. 8 and 9. For the rest, the circuit arrangement according to FIG. 8 corresponds to the circuit arrangement according to FIG. 3 and, for the rest, the circuit arrangement according to FIG. 9 corresponds to the circuit arrangement according to FIG. 3 so that repetitive explanations are omitted.

In both cases, the diode D1 is connected in each case in such a manner that its anode terminal is connected to the first connection terminal K1 whereas the cathode terminal is connected to the drain terminal of the power MOSFET or MOSFETs HS, HS1, HS2 used as high-side switch(es).

The diode D1 is integrated in a third conductor chip IC3 which is accommodated jointly with the first semiconductor chip IC1 and the second semiconductor chip IC2 in the common package PA.

Figure 10:
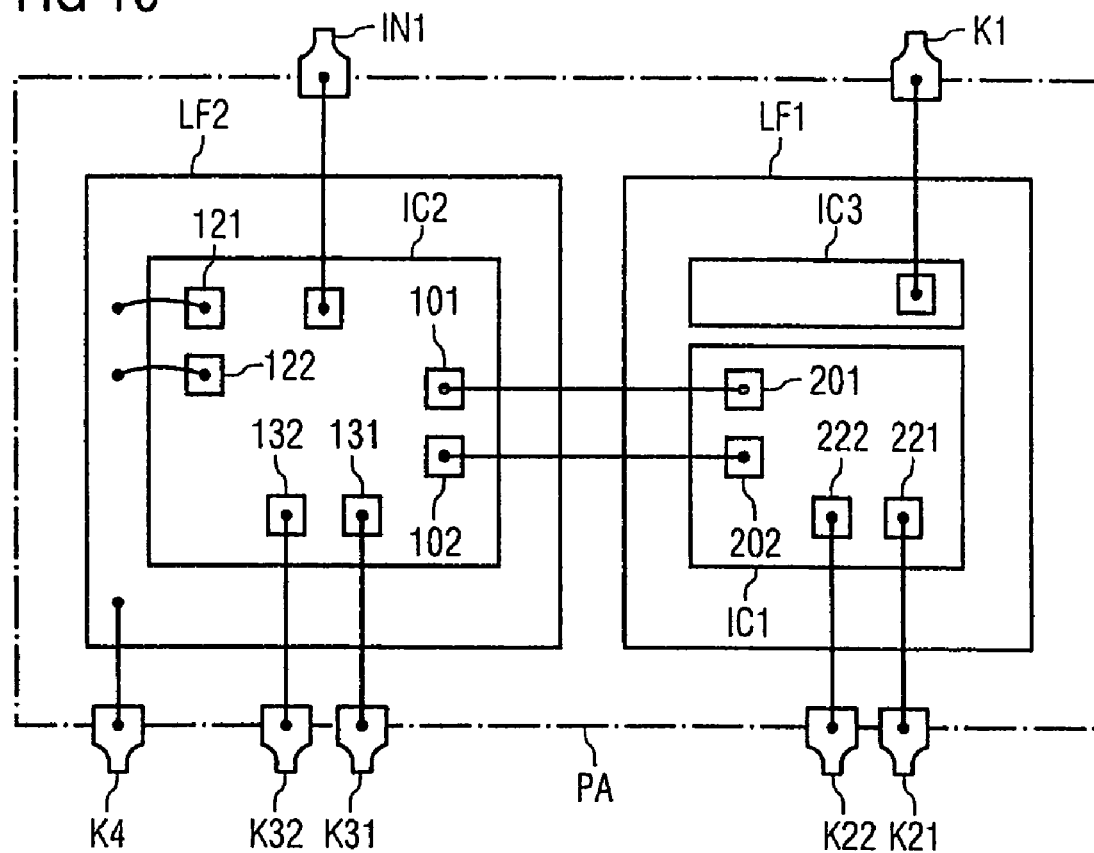
FIG. 10 shows a top view of a semiconductor module with three semiconductor chips in which a driving circuit according to FIG. 9 is integrated.

FIG. 10 shows a top view of a semiconductor module with three semiconductor chips IC1, IC2, IC3 in which the circuit arrangements according to FIG. 9 is integrated. This semiconductor module according to FIG. 10 differs from that shown in FIGS. 4 and 5 in that the third semiconductor chip IC3 is present which is accommodated jointly with the first semiconductor chip IC1 on the first lead frame LF1. The diode D3 integrated in the third semiconductor chip IC3 is constructed as a vertical diode, the rear of the semiconductor chip IC3, facing the lead frame LF1, forming the cathode terminal of the diode D1. Since the rear of the first semiconductor chip IC1 forms the common drain terminal of the power MOSFETs integrated in this semiconductor chip IC1, the cathode terminal of the diode is connected to the drain terminal of the high-side MOSFETs (HS1, HS2 in FIG. 9) directly via the lead frame LF1. In the module according to FIG. 10, the connection leg K1 representing the first connection terminal, to which the positive supply potential Vbb is applied in operation, is connected to the front of the third semiconductor chip IC3 which forms the anode terminal of the diode integrated in the semiconductor chip IC3. For the rest, the structure of the semiconductor module according to FIG. 10 corresponds to the structure of the semiconductor module in FIGS. 4 and 5 so that repetitive explanations are omitted here.

Figure 11:
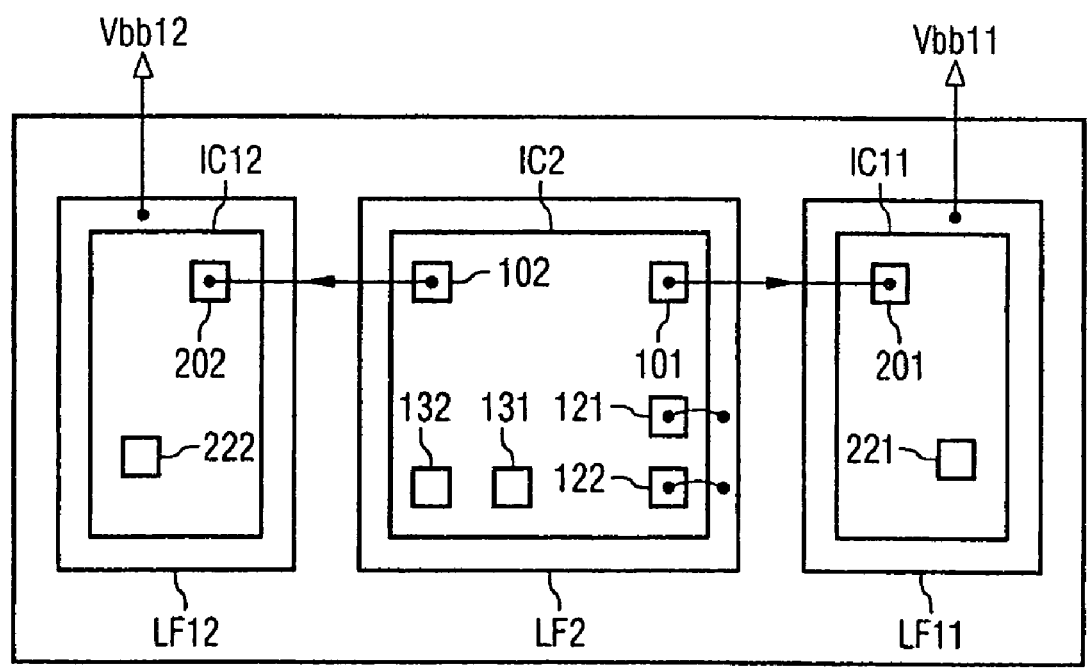
FIG. 11 shows a further exemplary embodiment of a semiconductor module in a top view, in which a circuit according to FIG. 3 is integrated.

FIG. 11 shows a modification of the semiconductor module, represented in FIGS. 4 and 5, for implementing a circuit according to FIG. 3. This semiconductor module differs from the semiconductor module previously explained in that there are two semiconductor chips IC11, IC12 in which in each case a part of the first semiconductor switches is integrated. The second semiconductor chip IC2 with the second semiconductor switches LS1, LS2 is constructed in accordance with the second semiconductor chip IC2 previously explained. The semiconductor switches integrated in the two first semiconductor chips IC11, IC12 are constructed as vertical power MOSFETs so that the drain terminals of these components are in each case formed by the rear of the semiconductor chips IC11, IC12 which are mounted on electrically conductive lead frames LF11, LF12. On the fronts of the semiconductor chips facing away from the lead frames LF11, LF12, source connection areas 221, 222 are in each case located which are connected to connection legs in a manner not shown in greater detail, and connection areas for supplying the driving signals S11, S12 from the second semiconductor chip IC2. The advantage of distributing the first semiconductor switches HS1, HS2 to two or more semiconductor chips IC11, IC12 consists in that the two first semiconductor chips IC11, IC12 can be supplied with different supply potentials Vbb11, Vbb12 via their lead frames LF11, LF12 in order to be able to provide in this manner load circuits for ignition elements having different supply voltages.

List of Reference Designations

D Drain terminal
D1 Diode
DH10, DH11 Control circuits
DL10, DL11 Control circuits
G Gate terminal
GND Reference potentials
HS1, HS2 First semiconductor switches, high-side switches
HS10, HS11 First semiconductor switches, high-side switches
IC1 First semiconductor chip
IC10, IC20 Driving circuits
IC11, IC12 Semiconductor chips
IC2 Second semiconductor chip
IC3 Third semiconductor chip
IN1 Enable signal input
IN2 Driving signal input
K1 First connection terminal
K2, K21, K22 Second connection terminals
K3, K31, K32 Third connection terminals
K4 Fourth connection terminal
LF1, LF2 Electrically conductive supports, lead frames
LF11, LF12 Lead frames
LS1, LS2 Second semiconductor switches, low-side switches
LS10, LS11 Second semiconductor switches, low-side switches
PA Package
S Source terminal
S1, S2 Driving signals
S1, S12 Driving signals
S21, S22 Driving signals
Sin1 Enable signal
Sin2 Driving signal
TR Electrically insulating support
Vbb, Vbb11, Vbb12 Supply potentials
Z1, Z2 Ignition elements
Z10, Z20 Ignition elements
130-132 Connection areas
1, 2 Control circuits
11, 12 Driver circuits
24 Interface circuit
10, 20 Control circuits
18, 19 Logic elements
21, 22 Driver circuits
101, 102 Connection areas
101, 102 Signal connection terminals
230 Connection area
121, 122 Connection areas
121, 222 Connection areas
201, 202 Connection areas
201, 202 Signal connection terminals

The invention claimed is:
1. A driving circuit for an ignition element of a passenger protection system, comprising:

a first semiconductor component having a control connection and a load connection, the first semiconductor component being integrated in a first semiconductor chip;

a second semiconductor component with a control connection and a load connection, the second semiconductor component being integrated in a second semiconductor chip;

a common package for supporting said first semiconductor chip and said second semiconductor chip, said common package including a first connection terminal and a second connection terminal for connecting a load in series between said first semiconductor component load connection and said second semiconductor component load connection external to the common package, wherein said first semiconductor chip has a plurality of said first semiconductor components integrated on said first semiconductor chip; and said second semiconductor chip has a plurality of said second semiconductor components integrated on said second semiconductor chip.

2. The driving circuit of claim 1 further comprising: a third semiconductor chip in said common package and some of said first semiconductor components in said plurality of said first semiconductor components are integrated on the third semiconductor chip and others of said first semiconductor components in said plurality of said first semiconductor components are integrated on the first semiconductor chip.

3. The driving circuit of claim 1, further comprising: a first electrically conductive support plate on which said first semiconductor chip is mounted; and a second electrically conductive support plate on which said second semiconductor chip is mounted.

4. The driving circuit of claim 3 wherein said common package is formed from electrically insulating material.

5. A driving circuit for an ignition element of a passenger protection system, comprising:

a first semiconductor component having a control connection and a load connection, the first semiconductor component being integrated in a first semiconductor chip;

a second semiconductor component with a control connection and a load connection, the second semiconductor component being integrated in a second semiconductor chip;

a common package for supporting said first semiconductor chip and said second semiconductor chip, said common package including a first connection terminal and a second connection terminal for connecting a load in series between said first semiconductor component load connection and said second semiconductor component load connection external to the common package; and an interface circuit integrated on one of the first and the second semiconductor chips, said interface circuit for supplying a driving signal for the first and the second semiconductor components on the first and the second semiconductor chips.

6. The driving circuit of claim 5 further comprising: an enable signal connection for supplying an enable signal to said semiconductor components integrated on said semiconductor chip not having said interface circuit.

7. A driving circuit for an ignition element of a passenger protection system, comprising:

a first semiconductor component having a control connection and a load connection, the first semiconductor component being integrated in a first semiconductor chip;

a second semiconductor component with a control connection and a load connection, the second semiconductor component being integrated in a second semiconductor chip;

a common package for supporting said first semiconductor chip and said second semiconductor chip, said common package including a first connection terminal and a second connection terminal for connecting a load in series between said first semiconductor component load connection and said second semiconductor component load connection external to the common package; and a third semiconductor chip on which a diode is integrated, the diode being in electrical series with said first semiconductor component.

8. The driving circuit of claim 7 further comprising: a common circuit board on which said first semiconductor chip and said third semiconductor chip are mounted, the common circuit board electrically connecting said first semiconductor component and said diode.

9. A driving circuit for an ignition element of a passenger protection system, comprising:

a first semiconductor component having a control connection and a load connection, the first semiconductor component being integrated in a first semiconductor chip;

a second semiconductor component with a control connection and a load connection, the second semiconductor component being integrated in a second semiconductor chip;

a common package for supporting said first semiconductor chip and said second semiconductor chip, said common package including a first connection terminal and a second connection terminal for connecting a load in series between said first semiconductor component load connection and said second semiconductor component load connection external to the common package, wherein said first semiconductor component is integrated in said first semiconductor chip using a first semiconductor technology; and said second semiconductor component is integrated in the second semiconductor chip with a semiconductor technology different than said first semiconductor technology.

10. The driving circuit of claim 9 wherein said first semiconductor component is a vertical transistor integrated in said first semiconductor chip.

11. The driving circuit of claim 9 wherein said second semiconductor component is integrated with a BCD technology.

12. The driving circuit of claim 10 wherein said vertical transistor is integrated with a BCD technology.

13. A driving circuit for an ignition element of a passenger protection system, comprising:

a first ignition element control component integrated in a first semiconductor chip; a second ignition element control component integrated in a second semiconductor chip; and a common package for housing said first semiconductor chip and said second semiconductor chip, said common package including a first connection terminal and a second connection terminal for electrically connecting an ignition element between said first ignition element control component and said second ignition element control component, said ignition element being external to the common package, and wherein a plurality of first ignition element control components are integrated in the first semiconductor chip;

a plurality of second ignition element control components are integrated in the second semiconductor chip; and the first and the second connection terminals of the common package electrically connect the external ignition element between the plurality of first ignition element control components and the plurality of second ignition element control components.

14. A driving circuit for an ignition element of a passenger protection system, comprising:

a first ignition element control component integrated in a first semiconductor chip; a second ignition element control component integrated in a second semiconductor chip;

a common package for housing said first semiconductor chip and said second semiconductor chip, said common package including a first connection terminal and a second connection terminal for electrically connecting an ignition element between said first ignition element control component and said second ignition element control component, said ignition element being external to the common package;

a first electrically conductive support plate on which said first semiconductor chip is mounted; and a second electrically conductive support plate on which said second semiconductor chip is mounted, said first and said second electrically conductive support plates being electrically insulated from one another.

15. A driving circuit for an ignition element of a passenger protection system, comprising:

a first ignition element control component integrated in a first semiconductor chip; a second ignition element control component integrated in a second semiconductor chip;

a common package for housing said first semiconductor chip and said second semiconductor chip, said common package including a first connection terminal and a second connection terminal for electrically connecting an ignition element between said first ignition element control component and said second ignition element control component, said ignition element being external to the common package; and an interface circuit integrated on one of said first and said second semiconductor chips, said interface circuit electrically connecting signals to the ignition element control components on said semiconductor chip on which the interface circuit is integrated and to components on another semiconductor chip in said common package.

16. The driving circuit of claim 15, wherein the components on the other semiconductor chip comprise the ignition element control components integrated on said other semiconductor chip in said common package.

17. The driving circuit of claim 15 wherein the common package is a molded chip package.

18. A driving circuit for an ignition element of a passenger protection system, comprising:

a first ignition element control component integrated in a first semiconductor chip; a second ignition element control component integrated in a second semiconductor chip;

a common package for housing said first semiconductor chip and said second semiconductor chip, said common package including a first connection terminal and a second connection terminal for electrically connecting an ignition element between said first ignition element control component and said second ignition element control component, said ignition element being external to the common package; and an enable circuit integrated in said first semiconductor chip for enabling said ignition element control components on said first semiconductor chip.

* * * * *